United States Patent [19]

Miyasako

[11] Patent Number: 4,692,711
[45] Date of Patent: Sep. 8, 1987

[54] CURRENT MIRROR CIRCUIT
[75] Inventor: Yoji Miyasako, Yokohama, Japan
[73] Assignee: Kabushiki Kaisha Toshiba, Kawasaki, Japan
[21] Appl. No.: 882,356
[22] Filed: Jul. 7, 1986
[30] Foreign Application Priority Data
  Jul. 17, 1985 [JP] Japan .................. 60-157890
[51] Int. Cl.⁴ ............................. H03F 3/45
[52] U.S. Cl. ................................. 330/257
[58] Field of Search ........... 330/257, 288; 323/315, 323/316

[56] References Cited
U.S. PATENT DOCUMENTS
  4,437,023  3/1984  Gill ................... 307/297

FOREIGN PATENT DOCUMENTS
  2546687  5/1984  France .

Primary Examiner—Gene Wan
Attorney, Agent, or Firm—Oblon, Fisher, Spivak, McClelland, & Maier

[57] ABSTRACT

This invention is described a current mirror circuit. In a current mirror circuit wherein there are provided first and second transistors which have their emitters in common and constitute a differential amplification circuit, third and fourth transistors which have their bases in common, emitters of the first and second transistors are coupled with a constant current source, a collector of the second transistor is coupled with bases of the third and fourth transistors, a collector of the third transistor is coupled with a base of the first transistor and an input current source, a base of the second transistor is coupled with a bias node, emitters of the third and fourth transistors are coupled with a reference power source, a collector of the fourth transistor is coupled with an output node, a collector of the first transistor is coupled with the reference power source through a load resistance, and a capacitor for coupling the base and the collector of the first transistor each other.

3 Claims, 5 Drawing Figures

CURRENT MIRROR CIRCUIT

BACKGROUND OF THE INVENTION

1. Field of the Invention

This invention relates to a current mirror circuit which is employable in an integrated circuit, etc. and more particularly to a current source circuit that is actuated by a low voltage.

2. Description of the Prior Art

A conventional example of a current mirror circuit is shown in FIG. 1. NPN transistors 1 and 2 are constituting a differential amplification circuit. A transistor 3 is a PNP transistor on the current input side. A transistor 4 is a PNP transistor on the current output side. A capacitor $C_1$ and a resistor $R_B$ are stabilized AC feedback elements. A current source $I_{IN}$ is an input constant current source. A current source $I_{OUT}$ is an output constant current source. A current source $I_o$ is a constant current source and $V_{cc}$ is a power supply.

The minimum actuation power supply voltage for this circuit is roughly "$V_{BE}+2V_{CE}$" (where $V_{BE}$ is base-emitter voltage and $V_{CE}$ is collector-emitter voltage). When $V_{BE}=0.7$ V and $V_{CE}=0.1$ V, $V_{BE}+2V_{CE}=0.9$ V, and the circuit thus operates at low voltage. Also, thanks to the use of a feedback circuit, there is stable production of output current even if fluctuations in the $h_{fe}$ of lateral PNP transistors 3 and 4 occur.

However, in the conventional circuit of FIG. 1, it is necessary to have an AC feedback circuit $C_1$ and $R_B$ with a large CR time constant, since the circuit operates as a differential amplification circuit and as an emitter-grounded amplifier for PNP transistor 3. That is, since the differential amplification circuit's load is between the base and emitter of transistor 4, the output voltage (AC feedback voltage) V1 is small and stability with respect to oscillation, etc. is poor. Improvement in this respect could be made by making the values of capacitor $C_1$ and resistor $R_B$ large but from consideration of NPN transistor $h_{fe}$ fluctuation it is not possible to make the value of $R_B$ large. It is therefore necessary to increase C in order to increase the amount (to effect stabilization) of AC feedback. Although a feedback circuit is included, the circuit is unstable (is liable to oscillate), since the negative feedback phase and amplitude change due to the effects of parasitic capacitance and the $f_T$ (operating frequency at which $h_{fe}$ is 1) of PNP transistor 3.

SUMMARY OF THE INVENTION

It is an object of the present invention to provide a current mirror circuit that operates stably at low voltage.

This invention is a current mirror circuit in which there are provided first and second transistors which have their emitters in common and constitute a differential amplification circuit, third and fourth transistors which have their bases in common, emitters of the first and second transistors are coupled with a constant current source, a collector of the second transistor is coupled with bases of the third and fourth transistors, a collector of the third transistor is coupled with a base of the first transistor and an input current source, a base of the second transistor is coupled with a bias node, emitters of the third and fourth transistors are coupled with a reference power source, a collector of the fourth transistor is coupled with an output node, a collector of the first transistor is coupled through a load resistance with the reference power source, and a capacitor for coupling the base and the collector of the first transistor each other.

DETAILED DESCRIPTION OF THE PREFERRED EMBODIMENTS

Figure 1:
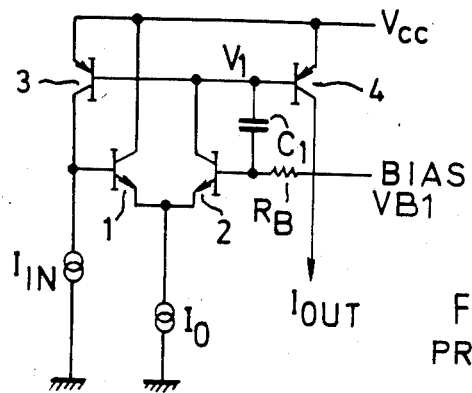
FIG. 1 is a circuit diagram of a conventional current mirror circuit.
Figure 2:
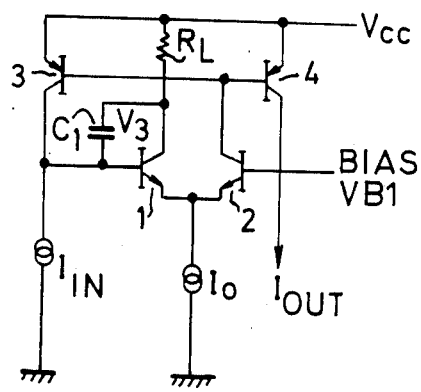
FIG. 2 through FIG. 5 are circuit diagrams of embodiments of the present invention.

An embodiment of the invention will now be described with reference to the drawings. FIG. 2 is a circuit diagram of this embodiment and since this is an example of a circuit in correspondence to the circuit of FIG. 1, like parts are identified by like symbols. As seen in the drawing, there are provided NPN transistors 1 and 2 which have a common emitter and constitute a differential amplification circuit and PNP transistors 3 and 4 with a common base, and the emitters of transistors 1 and 2 couple with ground through a constant current source $I_o$. The collector of transistor 2 couples to the bases of transistors 3 and 4, the collector of transistor 1 is coupled with one end of a load resistor $R_L$, and the emitters of transistors 3 and 4 and the other end of load resistor $R_L$ are coupled with a reference power source $V_{cc}$. The base of transistor 2 is coupled with a bias node VB1. The collector of transistor 3 is coupled with ground through an input constant current source $I_{IN}$ and is also coupled with one end of a capacitor $C_1$ whose other end is coupled with the junction of the collector of transistor 1 and load resistor $R_L$. Output constant current $I_{OUT}$ is taken out from the collector of transistor 4.

In the circuit of FIG. 2, output that is of inverse phase to the output of the collector of transistor 2 of the differential amplifier that drives the base of input transistor 3 is taken out as the result of load resistor $R_L$ being inserted in the collector circuit of transistor 1. And a stable current mirror circuit is produced as the result of negative AC feedback imposed on the base of transistor 1 of the differential amplifier by the voltage of the collector of transistor 1.

In the circuit of FIG. 2, CR can be a small value since the amount of AC feedback is large. In more detail, since the load of the differential amplification circuit is resistor $R_L$, even if the value of $R_L$ is small, the AC feedback voltage $V_3$ is effectively larger than in the case of the circuit of FIG. 1. Also, the impedance at the base terminal of transistor 1 of the differential amplifier is extremely high, with the result that there is stability (maximum feedback) even if the value of capacitor $C_1$ is small.

Since, for the above same reasons, the amount of AC feedback is large, the circuit of FIG. 2 is stable with respect to parasitic capacitance and fluctuations in the $f_T$ of lateral PNP transistor 3.

Figure 3:
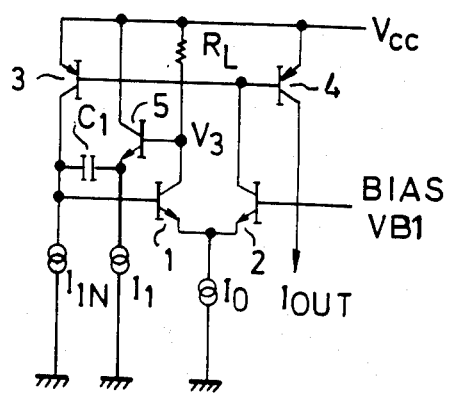

FIG. 3 is another embodiment of the invention which is characterized in that the AC feedback voltage $V_3$ is fed back through a buffer circuit consisting of a transistor 5 and a constant current source $I_1$. As the remainder of the configuration is the same as in the preceding embodiment, like parts are identified by like symbols and a description thereof is omitted.

Figure 4:
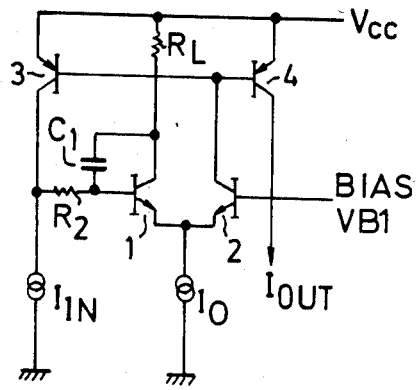

FIG. 4 is further embodiment of the invention in which the amount of AC feedback is increased by using a resistor $R_2$ to make the impedance of transistor 1 still greater.

Figure 5:
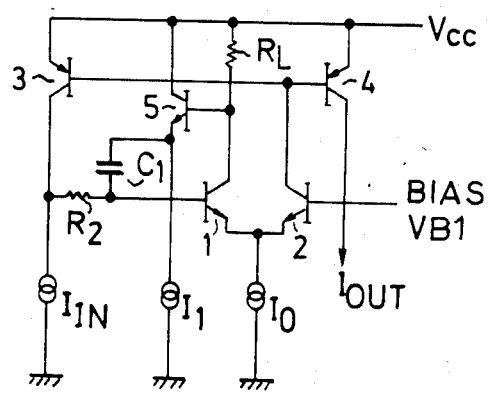

FIG. 5 is yet another embodiment of the invention which combines the embodiments of FIG. 3 and FIG. 4.

As described above, the invention provides a current mirror circuit which is suitable for circuit integration since it is possible to obtain a large amount of AC feedback with a low CR value.

While different embodiments of the present invention have been disclosed, it will be apparent to those skilled in the art that variations and modifications may be made therein without departing from the spirit and the scope of the invention as claimed.

What is claimed is:

1. A current mirror circuit comprising:

first and second transistors which have their emitters in common and constitute a differential amplification circuit;

third and fourth transistors which have their bases in common;

emitters of said first and second transistors are coupled with a constant current source;

a collector of said second transistor is coupled with bases of said third and fourth transistors;

a collector of said third transistor is coupled with a base of said first transistor and an input current source;

a base of said second transistor is coupled with a bias node;

emitters of said third and fourth transistors are coupled with a reference power source;

a collector of said fourth transistor is coupled with an output node;

a collector of said first transistor is coupled with said reference power source through a load resistance; and a capacitor for coupling the base and the collector of said first transistor each other.

2. A current mirror according to claim 1, wherein said capacitor and the junction of said load resistance and the collector of said first transistor are coupled through a buffer means.

3. A current mirror according to claim 2, wherein said buffer means is constituted by a fifth transistor which has its base coupled with said junction of said load resistance and the collector of said first transistor, its emitter coupled with said capacitor and its collector coupled with said reference power source.

* * * * *